(12) United States Patent
Zhang

(10) Patent No.: US 10,680,042 B2
(45) Date of Patent: Jun. 9, 2020

(54) DISPLAY DEVICE INCLUDING INTEGRATED CIRCUIT PORTS CONNECTED TO SUB-PIXELS USING CROSS DIAGONAL WIRES

(71) Applicants: Kunshan New Flat Panel Display Technology Center Co., Ltd., Kunshan (CN); Kunshan Go-Visionox Opto-Electronics Co., Ltd., Kunshan (CN)

(72) Inventor: Tingting Zhang, Kunshan (CN)

(73) Assignees: Kunshan New Flat Panel Display Technology Center Co., Ltd. (CN); Kunshan Go-Visionox Opto-Electronics Co., Ltd. (CN)

( * ) Notice: Subject to any disclaimer, the term of this patent is extended or adjusted under 35 U.S.C. 154(b) by 116 days.

(21) Appl. No.: 15/781,631

(22) PCT Filed: Mar. 15, 2017

(86) PCT No.: PCT/CN2017/076747
§ 371 (c)(1),
(2) Date: Jun. 5, 2018

(87) PCT Pub. No.: WO2017/162077
PCT Pub. Date: Sep. 28, 2017

(65) Prior Publication Data
US 2019/0378882 A1    Dec. 12, 2019

(30) Foreign Application Priority Data
Mar. 25, 2016    (CN) .................... 2016 2 0238403 U

(51) Int. Cl.
*H01L 27/32*    (2006.01)
*G09G 3/3275*    (2016.01)

(52) U.S. Cl.
CPC ....... *H01L 27/3218* (2013.01); *G09G 3/3275* (2013.01); *H01L 27/3213* (2013.01); *H01L 27/3276* (2013.01); *G09G 2300/0452* (2013.01)

(58) Field of Classification Search
CPC ............. H01L 27/3218; H01L 27/3213; H01L 27/3276; G09G 3/3275
See application file for complete search history.

(56) References Cited

U.S. PATENT DOCUMENTS 8,149,228 B2    4/2012   Lin et al.
8,520,160 B2    8/2013   You et al.
(Continued)

FOREIGN PATENT DOCUMENTS

CN    104037197 A   *  9/2014   ......... H01L 27/3218
CN    104037197 A       9/2014
(Continued)

OTHER PUBLICATIONS

International Search Report for PCT/CN2017/076747 dated Jun. 16, 2017.
(Continued)

*Primary Examiner* — Matthew E. Gordon
(74) *Attorney, Agent, or Firm* — Lerner, David, Littenberg, Krumholz & Mentlik, LLP

(57) ABSTRACT

A display including a pixel structure, an integrated circuit, and diagonal wires. The pixel structure includes a plurality of units. Each unit includes first and second pixel units. The first pixel unit is axial symmetrical to the second pixel unit. The arrangement of the pixel structure is RGBBGR. The integrated circuit has a plurality of ports arranged in a form of sequential red sub-pixel port, green sub-pixel unit port, and blue sub-pixel port repeatedly. The diagonal wires includes first and second crossing diagonal wires arranged
(Continued)

crosswise. The first crossing diagonal wire is configured to connect a data line of a column where the red sub-pixel (R) of the second pixel unit is positioned, to the red sub-pixel port, and the second cross diagonal wire is configured to connect a data line of a column where the green sub-pixel (G) of the second pixel unit is positioned, to the green sub-pixel port.

15 Claims, 3 Drawing Sheets

(56) References Cited

U.S. PATENT DOCUMENTS

| | | |
|---|---|---|
| 2009/0033845 A1 | 2/2009 | Tanno et al. |
| 2009/0322215 A1 | 12/2009 | Sung et al. |
| 2013/0070003 A1 | 3/2013 | Shohraku et al. |
| 2015/0091785 A1 | 4/2015 | Lee |
| 2015/0213772 A1 | 7/2015 | Tung et al. |
| 2016/0329385 A1 | 11/2016 | Qiu et al. |
| 2017/0032749 A1* | 2/2017 | Liu ................. G09G 3/3614 |
| 2019/0033609 A1* | 1/2019 | Kim ................. G03H 1/0808 |

FOREIGN PATENT DOCUMENTS

| | | |
|---|---|---|
| CN | 204257652 U | 4/2015 |
| CN | 105093737 A | 11/2015 |
| CN | 205487172 U | 8/2016 |
| JP | 200936795 A | 2/2009 |
| JP | 2011096378 A | 5/2011 |
| JP | 201358323 A | 3/2013 |
| TW | I274221 B | 2/2007 |
| TW | 201102731 A | 1/2011 |
| TW | 201530526 A | 8/2015 |
| WO | 2011152483 A1 | 12/2011 |
| WO | 2015101328 A1 | 7/2015 |

OTHER PUBLICATIONS

Search Report & First Office Action for Taiwan Patent Application No. 106109827 dated Mar. 7, 2018.
European Extended Search Report of Parallel European Patent Application No. 17769354.6 dated Dec. 7, 2018.

* cited by examiner

DISPLAY DEVICE INCLUDING INTEGRATED CIRCUIT PORTS CONNECTED TO SUB-PIXELS USING CROSS DIAGONAL WIRES

CROSS REFERENCE TO RELATED APPLICATIONS

The present application is a national phase entry under 35 U.S.C. § 371 of International Application No. PCT/CN2017/076747, filed Mar. 15, 2017, which claims priority from Chinese Patent Application No. 201620238403.4 filed Mar. 25, 2016, all of which are hereby incorporated herein by reference.

TECHNICAL FIELD

The present disclosure relates to the field of display technology, and more particularly, to a display and a method for manufacturing the same.

BACKGROUND

The display technology based on OLED (Organic Light-Emitting Diode) is a self-luminous display technology, which is characterized in a low driving voltage, a wide viewing angle, a high efficiency, a fast response speed, and that it is easy to realize full-colorized large-area wall-mounted display and flexible display.

In applications, users present high requirement on display resolution. The resolution may be measured in PPI (pixels per inch) which is related to an arrangement of pixels. The arrangement of the pixels, for example, includes a V-delta pixel arrangement.

However, when the pixels are arranged in a V-delta structure, both the traditional output modes, for example, in a form of strip for RGB, and in a form of array for IGNIS, and the transmission mode of data lines do not match the V-delta structure.

SUMMARY

In view of the above, it is necessary to provide a display to address the problem in the prior art that the pixel structure does not match the V-delta structure.

A display is provided, including:

a pixel structure including a plurality of units arranged along a line respectively in both a longitudinal direction and a horizontal direction, wherein each unit includes a first pixel unit and a second pixel unit, each of the first and second pixel units includes a red sub-pixel, a green sub-pixel and a blue sub-pixel, the blue sub-pixel of the first pixel unit is adjacent to the blue sub-pixel of the second pixel unit, the red sub-pixel of the first pixel unit is axial symmetrical to the red sub-pixel of the second pixel unit, and the green sub-pixel of the first pixel unit is axial symmetrical to the green sub-pixel of the second pixel unit;

an integrated circuit having a plurality of ports including a plurality of port units arranged in sequence, each port unit including a red sub-pixel port, a green sub-pixel port and a blue sub-pixel port arranged in sequence; and diagonal wires, configured to connect the plurality of ports to a data line of each column of the pixel structure respectively, the diagonal wires including a first cross diagonal wire and a second cross diagonal wire arranged cross-wise, the first cross diagonal wire configured to connect a data line of a column where the red sub-pixel of the second pixel unit is positioned, to the red sub-pixel port, and the second cross diagonal wire configured to connect a data line of a column where the green sub-pixel of the second pixel unit is positioned, to the green sub-pixel port.

In one embodiment, the first pixel unit is divided into a first region and a second region in a longitudinal direction, the blue sub-pixel of the first pixel unit is positioned in the first region, the red sub-pixel and the green sub-pixel of the first pixel unit are positioned in the second region. In one embodiment, the second pixel unit and the first pixel unit are arranged in a mirror-symmetrical form, the first pixel unit and the second pixel unit adjacent to the first pixel unit in the horizontal direction are arranged in the mirror-symmetrical form, two adjacent first pixel units in the longitudinal direction are arranged in an alternately mirror-symmetrical form, and two adjacent second pixel units in the longitudinal direction are arranged in an alternately mirror-symmetrical form.

In one embodiment, the blue sub-pixel of the first pixel unit is formed in a shape of a rectangle with a side dimension in a row direction longer than another side dimension in a column direction. In one embodiment, each of the red sub-pixel and the green sub-pixel of the first pixel unit are respectively formed in a shape of a rectangle with a side dimension in the column direction longer than another side dimension in the row direction.

In one embodiment, the red sub-pixel and the green sub-pixel of the first pixel unit are different in size. In one embodiment, a side length of the red sub-pixel of the first pixel unit in the row direction is longer than a side length of the green sub-pixel of the first pixel unit in the row direction, and a side length of the red sub-pixel of the first pixel unit in the column direction is longer than a side length of the green sub-pixel of the first pixel unit in the column direction.

In one embodiment a sum of the side length of the red sub-pixel of the first pixel unit in the row direction and the side length of the green sub-pixel of the first pixel in the row direction is less than a side length of the blue sub-pixel of the first pixel unit in the row direction.

In one embodiment, the red sub-pixel of the first pixel unit and the green sub-pixel of the first pixel unit are identical in size.

In one embodiment, the blue sub-pixel of the first pixel unit includes a first blue sub-pixel and a second blue sub-pixel, each of the first and second blue sub-pixels is formed in a shape of a right triangle, and a hypotenuse of the first blue sub-pixel abuts against a hypotenuse of the second blue sub-pixel.

In one embodiment, all of the blue sub-pixel, the red sub-pixel and the green sub-pixel of the first pixel unit are respectively formed in circular.

In one embodiment, the blue sub-pixel of the first pixel unit is formed into a rectangular shape, the red sub-pixel of the first pixel unit is formed into a rectangular shape, and the green sub-pixel of the first pixel unit is formed into a circular shape.

In one embodiment, the blue sub-pixel of the first pixel unit is formed into a rectangular shape, the red sub-pixel of the first pixel unit is formed into a circular shape, and the green sub-pixel of the first pixel unit is formed into a rectangular shape.

A method for manufacturing a display is also provided, including:

providing a pixel structure including a plurality of units arranged along a line respectively in both a longitudinal direction and a horizontal direction, wherein each unit includes a first pixel unit and a second pixel unit, each of the first and second pixel units includes a red sub-pixel, a green sub-pixel and a blue sub-pixel, the blue sub-pixel of the first pixel unit is adjacent to the blue sub-pixel of the second pixel unit, the red sub-pixel of the first pixel unit is axial symmetrical to the red sub-pixel of the second pixel unit, and the green sub-pixel of the first pixel unit is axial symmetrical to the green sub-pixel of the second pixel unit, providing an integrated circuit having a plurality of ports including a plurality of port units arranged in sequence, each port unit including a red sub-pixel port, a green sub-pixel port and a blue sub-pixel port arranged in sequence; and connecting the plurality of ports to a data line of each column of the pixel structure respectively through diagonal wires, the diagonal wires including a first cross diagonal wire and a second cross diagonal wire arranged crosswise, wherein a data line of a column where the red sub-pixel of the second pixel unit is positioned is connected to the red sub-pixel port through the first cross diagonal wire, and a data line of a column where the green sub-pixel of the second pixel unit is positioned is connected to the green sub-pixel port through the second cross diagonal wire.

In one embodiment, providing the pixel structure includes forming the blue sub-pixel by evaporation with a slit-type mask, and forming the red sub-pixel and the green sub-pixel by evaporation with a slot-type mask.

In the above display, the pixel structure includes a plurality of units, each unit includes a first pixel unit and a second pixel unit, a blue sub-pixel of the first pixel unit is adjacent to a blue sub-pixel of the second pixel unit, a red sub-pixel of the first pixel unit is axial symmetrical to a red sub-pixel of the second pixel unit are arranged, and a green sub-pixel of the first pixel unit is axial symmetrical to a green sub-pixel of the second pixel unit, so that the pixels are arranged in a form of RGBBGRRGBBGR. The integrated circuit has a plurality of ports arranged in a form of a red sub-pixel port, a green sub-pixel port and a blue sub-pixel port in sequence. A first cross diagonal wire and a second cross diagonal wire are provided, the first cross diagonal wire is configured to connect a data line of a column where the red sub-pixel of the second pixel unit is positioned, to the red sub-pixel port, and the second cross diagonal wire is configured to connect a data line of a column where the green sub-pixel of the second pixel unit is positioned, to the green sub-pixel port. In this way, the arrangement of the data transmission of the R and G sub-pixels of the second pixel unit is reversed, so that the output mode and data transmission of the arrangement of the pixels match the V-delta structure.

DETAILED DESCRIPTION OF THE EMBODIMENTS

First Embodiment

Figure 1:
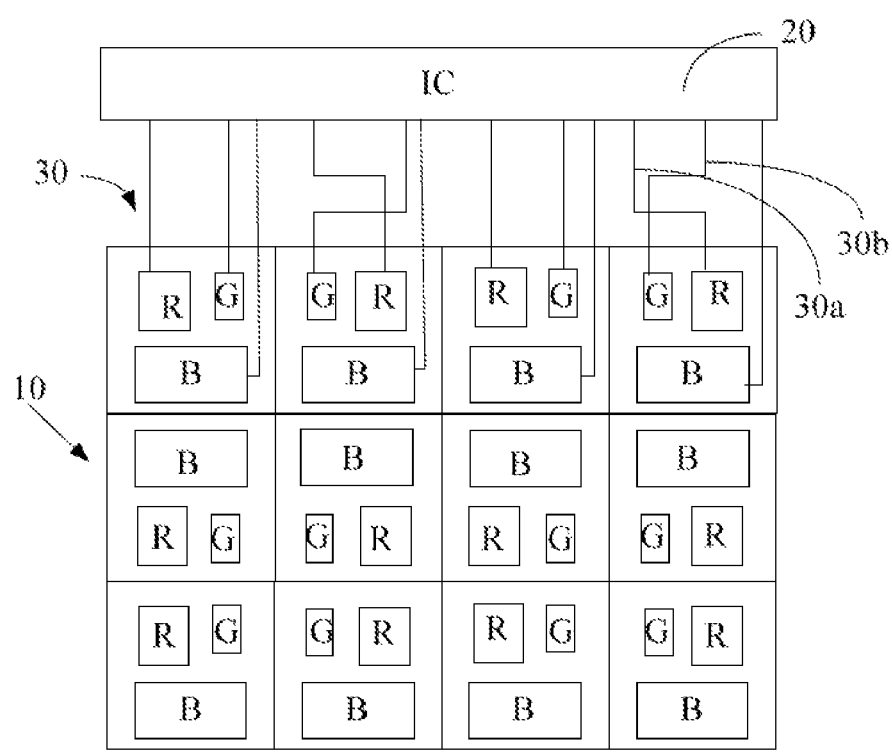
FIG. 1 is a structural schematic diagram illustrating a display according to a first embodiment of the present disclosure.
Figure 2:
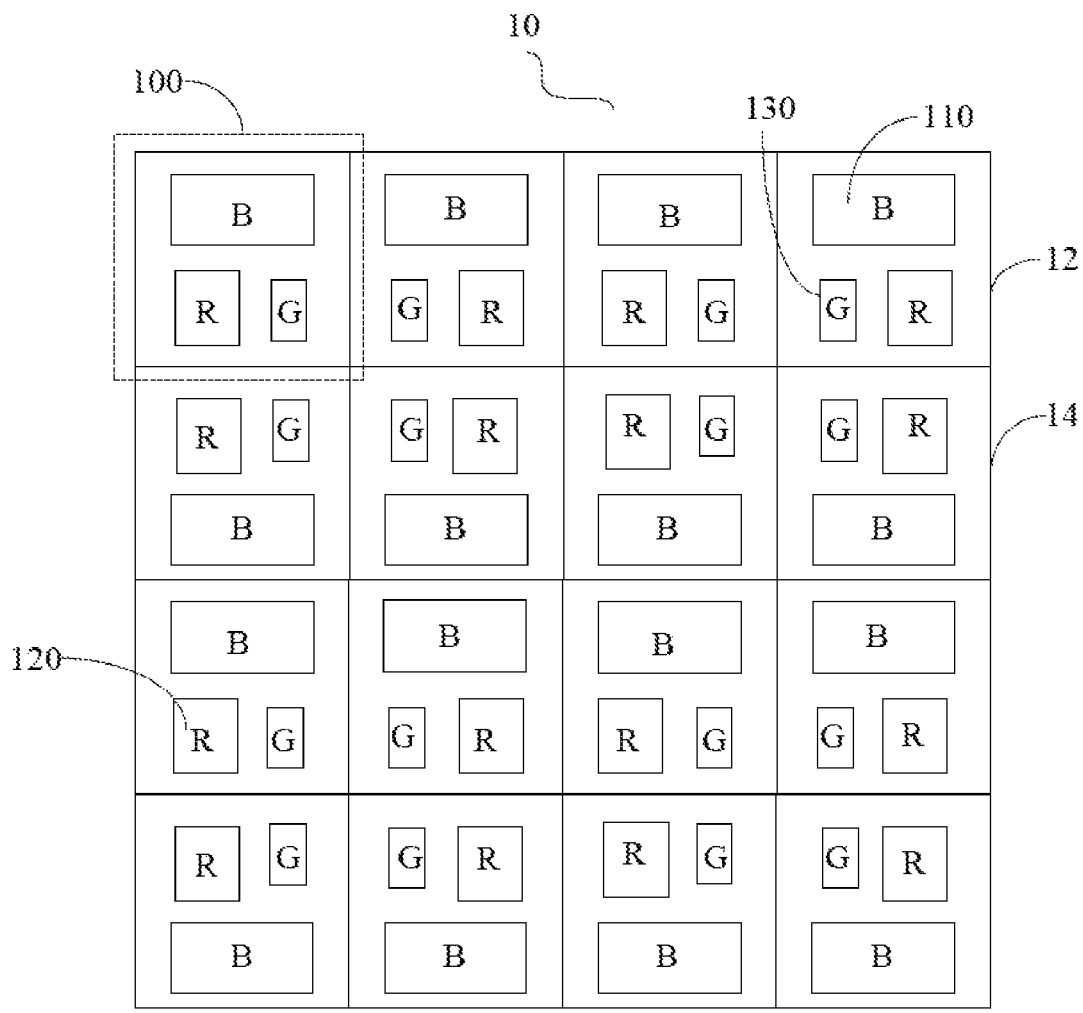
FIG. 2 is a structural schematic diagram illustrating a pixel structure according to the first embodiment shown in FIG. 1.

As shown in FIGS. 1-2, in this embodiment, the display includes a pixel structure 10, an integrated circuit 20 and diagonal wires 30. The pixel structure includes a plurality of units arranged along a line respectively in both a longitudinal direction and a horizontal direction. Each unit includes a first pixel unit 100a and a second pixel unit 100b.

Each of the first pixel unit 100a and the second pixel unit 100b includes a red sub-pixel R, a green sub-pixel G and a blue sub-pixel B. The blue sub-pixel B of the first pixel unit 100a is adjacent to the blue sub-pixel B of the second pixel unit 100b. The red sub-pixel R of the first pixel unit 100a is axial symmetrical to the red sub-pixel R of the second pixel unit 100b. The green sub-pixel G of the first pixel unit 100a is axial symmetrical to the green sub-pixel G of the second pixel unit 100b. In this way, the arrangement of the pixels in the pixel structure is in a form of RGBBGRRGBBGR.

The integrated circuit 20 has a plurality of ports arranged in a form of sequential red sub-pixel port, green sub-pixel port and blue sub-pixel port repeatedly.

Since the ports on the integrated circuit 20 are arranged in the form of sequential red sub-pixel port, green sub-pixel port and blue sub-pixel port repeatedly, while the pixels of the pixel structure 10 are arranged in the form of RGBBGR-RGBBGR, the output mode and data transmission of the arrangement of the pixels do not match the V-delta structure when the ports are connected to the data lines of the columns of the pixel structure 10 with the diagonal wires 30. Therefore, as shown in FIG. 1, the diagonal wires 30 include a first cross diagonal wire 30a and a second cross diagonal wire 30b.

The first cross diagonal wire 30a and the second cross diagonal wire 30b are arranged crosswise. The first cross diagonal wire 30a is configured to connect a data line of a column where the red sub-pixel of the second pixel unit 100b is positioned, to the red sub-pixel port, and the second cross diagonal wire 30b is configured to connect a data line of a column where the green sub-pixel of the second pixel unit 100b is positioned, to the green sub-pixel port. In this way, the arrangement of the data transmission of the R and G sub-pixels of the second pixel unit 100b is reversed, so that the output mode and data transmission of the arrangement of the pixels match the V-delta structure.

In this embodiment, as shown in FIG. 2, the pixel structure 10 according to the first embodiment includes a plurality of first pixel unit groups 12 and a plurality of second pixel unit groups 14. Each of the first and second pixel unit groups 12, 14 includes a plurality of units. The units are arranged along a line in the horizontal direction, to form a plurality of rows of pixel unit groups. The units are also arranged along a line in the longitudinal direction, to form a plurality of columns of pixel unit groups. Each unit includes a first pixel unit 100a and a second pixel unit 100b.

The first pixel unit 100a is in a shape of a square. The first pixel unit 100a includes a blue sub-pixel 100, a red sub-pixel 120 and a green sub-pixel. The second pixel unit 100b is mirror-symmetrical to the first pixel unit 100a.

Particularly, the first pixel unit group 12 forms a row, while the second pixel unit group 14 forms another row. As shown in FIG. 2, the first pixel unit 100a and the second pixel unit 100b are arranged in a mirror-symmetrical form in the horizontal direction. Two adjacent first pixel units 100a in the longitudinal direction are arranged in an alternately form, and two adjacent second pixel units 100b in the longitudinal direction are arranged in an alternately form.

Figure 3:
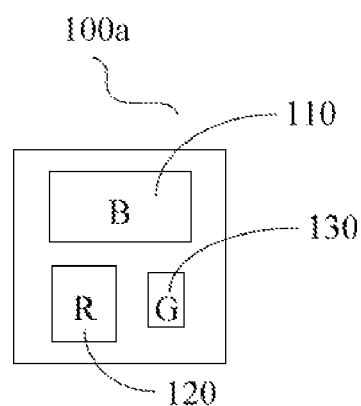
FIG. 3 is a structural schematic diagram illustrating a first pixel unit shown in FIG. 2.

As shown in FIG. 3, the first pixel unit 100a is in a shape of a square, which is divided in two regions including a first region and a second region in a longitudinal direction. The blue sub-pixel 110 is positioned in the first region, the red sub-pixel 120 and the green sub-pixel 130 are positioned in the second region, and there is no overlap between the red sub-pixel 120 and the green sub-pixel 130.

In this embodiment, each of the blue sub-pixel 100, the red sub-pixel 120 and the green sub-pixel 130 is in a shape of a rectangle. In particular, the blue sub-pixel 110 is formed in a shape of a rectangle with a side dimension in the row direction longer than another side dimension in the column direction, and each of the red sub-pixel 120 and the green sub-pixel 130 are formed in a shape of a rectangle with a side dimension in the column direction longer than another side dimension in the row direction. The side length of the red sub-pixel 120 in the row direction is longer than the side length of the green sub-pixel 130 in the row direction, and the side length of the red sub-pixel 120 in the column direction is also longer than the side length of the green sub-pixel 130 in the column direction. The red sub-pixel 120 and the green sub-pixel 130 are identical in shape, but different in size. In addition, a sum of the side length of the red sub-pixel 120 in the row direction and the side length of the green sub-pixel 130 in the row direction is less than the side length of the blue sub-pixel 110 in the row direction.

In addition, the blue sub-pixels 110 may be formed by evaporation with a slit-type mask, while the red sub-pixel 120 and the green sub-pixel 130 may be formed by evaporation with a slot-type mask. When the red sub-pixels 120 and the green sub-pixels 130 are identical in shape, the red sub-pixels 120 and the green sub-pixels 130 may be formed by evaporation plating with a common slot-type metal mask. That is to say, a same metal mask may be used for the evaporation for both the red sub-pixel 120 and the green sub-pixel 130 to reduce difficulty and cost of the manufacture of the mask.

In addition, if the blue sub-pixel is formed by evaporation with the slit-type mask, and the red sub-pixel and the green sub-pixel are formed by evaporation with a slot-type mask, the masks will have increased opening areas, to reduce difficulty in manufacturing mask. Moreover, it is not required to leave a space between two adjacent sub-pixels during evaporation, so as to improve the PPI of the display, while retaining the opening rate of the mask plate, and also to reduce the weight of the mask and improve the product yield to a certain extent.

Second Embodiment

Figure 4:
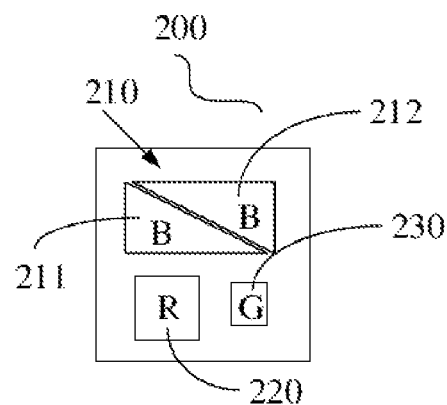
FIG. 4 is a structural schematic diagram illustrating a first pixel unit according to a second embodiment of the present disclosure.

As shown in FIG. 4, in this embodiment, the first pixel unit 200 is in a shape of a square, which is divided in two regions including a first region and a second region in a longitudinal direction. The blue sub-pixel 210 is positioned in the first region, the red sub-pixel 220 and the green sub-pixel 230 are positioned in the second region, and there is no overlap between the red sub-pixel 220 and the green sub-pixel 230. The blue sub-pixel 210 includes a first blue sub-pixel 211 and a second blue sub-pixel 212. Each of the first and second blue sub-pixels 211, 212 are in a shape of a right triangle, and a hypotenuse of the first blue sub-pixel 211 abuts against a hypotenuse of the second blue sub-pixel 212. The abutting means that the hypotenuse of the first blue sub-pixel 211 is parallel to and close to the hypotenuse of the second blue sub-pixel 212, so as to improve the diagonal effect to a certain extent.

Third Embodiment

Figure 5:
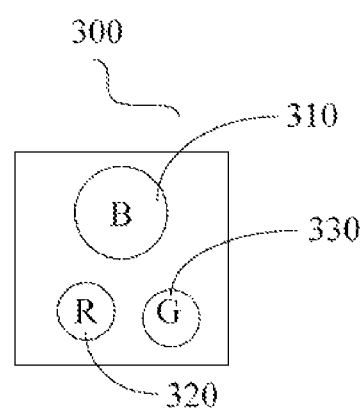
FIG. 5 is a structural schematic diagram illustrating a first pixel unit according to a third embodiment of the present disclosure.

As shown in FIG. 5, in this embodiment, the first pixel unit 300 is in a shape of a square, which is divided in two regions including a first region and a second region in a longitudinal direction. The blue sub-pixel 310 is positioned in the first region, the red sub-pixel 320 and the green sub-pixel 330 are positioned in the second region, and there is no overlap between the red sub-pixel 320 and the green sub-pixel 330. Each of the blue sub-pixel 310, the red sub-pixel 320 and the green sub-pixel 330 is in a shape of a circle. In this way, the masks have increased openings. In addition, the red sub-pixel 320 and the green sub-pixel 330 may be identical or different in size.

In other embodiments, the blue sub-pixel 310 may be in a shape of a rectangle or circle, the red sub-pixel 320 may be in a shape of a rectangle, and the green sub-pixel 330 may be in a shape of a circle. Alternatively, the blue sub-pixel 310 may be in a shape of a rectangle or circle, the red sub-pixel 320 may be in a shape of a circle, and the green sub-pixel 330 may be in a shape of a rectangle.

In the above display, the pixel structure includes a plurality of units, each unit includes a first pixel unit and a second pixel unit, a blue sub-pixel of the first pixel unit is adjacent to a blue sub-pixel of the second pixel unit, a red sub-pixel of the first pixel unit is axial symmetrical to a red sub-pixel of the second pixel unit are arranged, and a green sub-pixel of the first pixel unit is axial symmetrical to a green sub-pixel of the second pixel unit, so that the pixels are arranged in a form of RGBBGRRGBBGR. The integrated circuit has a plurality of ports arranged in a form of a red sub-pixel port, a green sub-pixel port and a blue sub-pixel port in sequence. A first cross diagonal wire and a second cross diagonal wire are provided, the first cross diagonal wire is configured to connect a data line of a column where the red sub-pixel of the second pixel unit is positioned, to the red sub-pixel port, and the second cross diagonal wire is configured to connect a data line of a column where the green sub-pixel of the second pixel unit is positioned, to the green sub-pixel port. In this way, the arrangement of the data transmission of the R and G sub-pixels of the second pixel unit is reversed, so that the output mode and data transmission of the arrangement of the pixels match the V-delta structure.

Technical features of the above embodiments may be combined arbitrarily. For brief description, not all of the possible combinations of the technical features of the above embodiments are described, but it will be appreciated that these possible combinations belong to the scope of the present disclosure once there is no conflict between the technical features.

The above are embodiments of the disclosure described in detail, and should not be deemed as limitations to the scope of the present disclosure. It should be noted that variations and improvements will become apparent to those skilled in the art to which the present disclosure pertains without departing from its scope. Therefore, the scope of the present disclosure is defined by the appended claims.

What is claimed is:

1. An organic light-emitting diode (OLED) display, comprising:
 a pixel structure including a plurality of units arranged along a line respectively in both a longitudinal direction and a horizontal direction, wherein each unit includes a first pixel unit and a second pixel unit, each of the first and second pixel units includes a red sub-pixel, a green sub-pixel and a blue sub-pixel, the blue sub-pixel of the first pixel unit is adjacent to the blue sub-pixel of the second pixel unit, the red sub-pixel of the first pixel unit is axial symmetrical to the red sub-pixel of the second pixel unit, and the green sub-pixel of the first pixel unit is axial symmetrical to the green sub-pixel of the second pixel unit;

an integrated circuit having a plurality of ports including a plurality of port units arranged in sequence, each port unit including a red sub-pixel port, a green sub-pixel port and a blue sub-pixel port arranged in sequence; and diagonal wires, configured to connect the plurality of ports to a data line of each column of the pixel structure respectively, the diagonal wires including a first cross diagonal wire and a second cross diagonal wire arranged crosswise, the first cross diagonal wire configured to connect a data line of a column where the red sub-pixel of the second pixel unit is positioned, to the red sub-pixel port, and the second cross diagonal wire configured to connect a data line of a column where the green sub-pixel of the second pixel unit is positioned, to the green sub-pixel port.

2. The display of claim 1, wherein the first pixel unit is divided into a first region and a second region in a longitudinal direction, the blue sub-pixel of the first pixel unit is positioned in the first region, the red sub-pixel and the green sub-pixel of the first pixel unit are positioned in the second region.

3. The display of claim 2, wherein the blue sub-pixel of the first pixel unit is formed in a shape of a rectangle with a side dimension in a row direction longer than another side dimension in a column direction.

4. The display of claim 2, wherein the red sub-pixel and the green sub-pixel of the first pixel unit are different in size.

5. The display of claim 4, wherein a sum of the side length of the red sub-pixel of the first pixel unit in the row direction and a side length of the green sub-pixel of the first pixel in the row direction is less than a side length of the blue sub-pixel of the first pixel unit in the row direction.

6. The display of claim 3, wherein the red sub-pixel of the first pixel unit and the green sub-pixel of the first pixel unit are identical in size.

7. The display of claim 3, wherein the blue sub-pixel of the first pixel unit includes a first blue sub-pixel and a second blue sub-pixel, each of the first and second blue sub-pixels is formed in a shape of a right triangle, and a hypotenuse of the first blue sub-pixel abuts against a hypotenuse of the second blue sub-pixel.

8. The display of claim 2, wherein all of the blue sub-pixel, the red sub-pixel and the green sub-pixel of the first pixel unit are respectively formed in circular.

9. The display of claim 2, wherein the blue sub-pixel of the first pixel unit is formed into a rectangular shape, the red sub-pixel of the first pixel unit is formed into a rectangular shape, and the green sub-pixel of the first pixel unit is formed into a circular shape.

10. The display of claim 2, wherein the blue sub-pixel of the first pixel unit is formed into a rectangular shape, the red sub-pixel of the first pixel unit is formed into a circular shape, and the green sub-pixel of the first pixel unit is formed into a rectangular shape.

11. The display of claim 2, wherein the second pixel unit and the first pixel unit are arranged in a mirror-symmetrical form, the first pixel unit and the second pixel unit adjacent to the first pixel unit in the horizontal direction are arranged in the mirror-symmetrical form, two adjacent first pixel units in the longitudinal direction are arranged in an alternately mirror-symmetrical form, and two adjacent second pixel units in the longitudinal direction are arranged in an alternately mirror-symmetrical form.

12. The display of claim 11, wherein each of the red sub-pixel and the green sub-pixel of the first pixel unit are respectively formed in a shape of a rectangle with a side dimension in the column direction longer than another side dimension in the row direction.

13. The display of claim 4, wherein a side length of the red sub-pixel of the first pixel unit in the row direction is longer than a side length of the green sub-pixel of the first pixel unit in the row direction, and a side length of the red sub-pixel of the first pixel unit in the column direction is longer than a side length of the green sub-pixel of the first pixel unit in the column direction.

14. A method for manufacturing an organic light-emitting diode (OLED) display, comprising: providing a pixel structure including a plurality of units arranged along a line respectively in both a longitudinal direction and a horizontal direction, wherein each unit includes a first pixel unit and a second pixel unit, each of the first and second pixel units includes a red sub-pixel, a green sub-pixel and a blue sub-pixel, the blue sub-pixel of the first pixel unit is adjacent to the blue sub-pixel of the second pixel unit, the red sub-pixel of the first pixel unit is axial symmetrical to the red sub-pixel of the second pixel unit, and the green sub-pixel of the first pixel unit is axial symmetrical to the green sub-pixel of the second pixel unit, providing an integrated circuit having a plurality of ports including a plurality of port units arranged in sequence, each port unit including a red sub-pixel port, a green sub-pixel port and a blue sub-pixel port arranged in sequence; and connecting the plurality of ports to a data line of each column of the pixel structure respectively through diagonal wires, the diagonal wires including a first cross diagonal wire and a second cross diagonal wire arranged crosswise, wherein a data line of a column where the red sub-pixel of the second pixel unit is positioned is connected to the red sub-pixel port through the first cross diagonal wire, and a data line of a column where the green sub-pixel of the second pixel unit is positioned is connected to the green sub-pixel port through the second cross diagonal wire.

15. The method of claim 14, wherein providing the pixel structure includes forming the blue sub-pixel by evaporation with a slit-type mask, and forming the red sub-pixel and the green sub-pixel by evaporation with a slot-type mask.

* * * * *